(12) United States Patent
Satoh et al.

(10) Patent No.: US 9,123,575 B1
(45) Date of Patent: Sep. 1, 2015

(54) SEMICONDUCTOR MEMORY DEVICE HAVING INCREASED SEPARATION BETWEEN MEMORY ELEMENTS

(71) Applicant: Avalanche Technology, Inc., Fremont, CA (US)

(72) Inventors: Kimihiro Satoh, Fremont, CA (US); Bing K Yen, Cupertino, CA (US); Dong Ha Jung, Pleasanton, CA (US); Yiming Huai, Pleasanton, CA (US)

(73) Assignee: Avalanche Technology, Inc., Fremont, CA (US)

(*) Notice: Subject to any disclaimer, the term of this patent is extended or adjusted under 35 U.S.C. 154(b) by 0 days.

(21) Appl. No.: 14/336,640

(22) Filed: Jul. 21, 2014

(51) Int. Cl.
| | |
|---|---|
| *H01L 27/00* | (2006.01) |
| *H01L 27/108* | (2006.01) |
| *H01L 27/06* | (2006.01) |
| *H01L 27/24* | (2006.01) |
| *H01L 45/00* | (2006.01) |
| *H01L 27/02* | (2006.01) |
| *H01L 27/115* | (2006.01) |

(52) U.S. Cl.
CPC ...... *H01L 27/10805* (2013.01); *H01L 27/0688* (2013.01); *H01L 27/2436* (2013.01); *H01L 45/12* (2013.01); *H01L 45/141* (2013.01); *H01L 27/0207* (2013.01); *H01L 27/11519* (2013.01); *H01L 27/11565* (2013.01)

(58) Field of Classification Search
CPC .............. H01L 27/0207; H01L 27/11519; H01L 27/11565
See application file for complete search history.

(56) References Cited

U.S. PATENT DOCUMENTS

| | | | | |
|---|---|---|---|---|
| 6,177,320 | B1* | 1/2001 | Cho et al. ...................... | 438/279 |
| 6,897,522 | B2* | 5/2005 | Harari et al. .................. | 257/324 |
| 6,992,343 | B2 | 1/2006 | Miyatake et al. | |
| 8,084,801 | B2 | 12/2011 | Baek et al. | |
| 8,110,872 | B2* | 2/2012 | Fujimoto ...................... | 257/330 |
| 8,129,709 | B2* | 3/2012 | Seko et al. ........................ | 257/5 |
| 8,362,581 | B2* | 1/2013 | Takenaga et al. ............. | 257/421 |
| 8,665,629 | B2* | 3/2014 | Park et al. ..................... | 365/148 |
| 8,829,682 | B2* | 9/2014 | Kim et al. ..................... | 257/774 |
| 8,957,483 | B2* | 2/2015 | Gilgen .......................... | 257/401 |
| 8,962,476 | B2* | 2/2015 | Lin et al. ....................... | 438/638 |
| 2005/0051831 | A1* | 3/2005 | Kajimoto et al. ............. | 257/314 |
| 2005/0087886 | A1* | 4/2005 | Leinbach ...................... | 257/786 |
| 2008/0061340 | A1* | 3/2008 | Heineck et al. ............... | 257/301 |
| 2008/0259133 | A1* | 10/2008 | Hara et al. ....................... | 347/70 |
| 2008/0303115 | A1* | 12/2008 | Miyazaki et al. ............. | 257/506 |
| 2009/0121268 | A1* | 5/2009 | Lee et al. ...................... | 257/296 |
| 2010/0081395 | A1* | 4/2010 | Woo et al. ........................ | 455/73 |
| 2012/0038005 | A1* | 2/2012 | Burgess et al. ............... | 257/401 |

(Continued)

*Primary Examiner* — Ida M Soward
(74) *Attorney, Agent, or Firm* — Bing K. Yen (57) ABSTRACT

The present invention is directed to a semiconductor memory device including a plurality of first level contacts arranged in an array with every third row vacant along a first direction, thereby forming multiple contact regions separated by multiple vacant regions along the first direction with each of the multiple contact regions including a first row and a second row of the first level contacts extending along a second direction; a first and second plurality of second level contacts formed on top of the first level contacts with the second plurality of second level contacts having elongated shape extending into the vacant regions adjacent thereto; and a first and second plurality of memory elements formed on top of the first and second plurality of second level contacts, respectively, thereby permitting the memory elements to have greater center-to-center distance between two closest neighbors than the first level contacts.

16 Claims, 7 Drawing Sheets

(56) References Cited

U.S. PATENT DOCUMENTS

| | | | |
|---|---|---|---|
| 2012/0049380 A1* | 3/2012 | Kim et al. | 257/773 |
| 2012/0199895 A1* | 8/2012 | Nitta | 257/295 |
| 2014/0042509 A1* | 2/2014 | Park et al. | 257/296 |
| 2015/0069377 A1* | 3/2015 | Rabkin et al. | 257/43 |

* cited by examiner

SEMICONDUCTOR MEMORY DEVICE HAVING INCREASED SEPARATION BETWEEN MEMORY ELEMENTS

BACKGROUND

The present invention relates to a semiconductor memory device, and more particularly, to example embodiments of a memory cell structure that can maximize the separation spacing between closest adjacent memory elements for a given memory cell size.

A semiconductor memory device normally comprises an array of memory cells, each of which includes a memory element and a selection transistor coupled in series between two electrodes. The selection transistor functions like a switch to direct current or voltage through the selected memory element coupled thereto. Upon application of an appropriate voltage or current to the memory element, the electrical property of the memory element would change accordingly, thereby switching the stored logic in the respective memory cell.

A semiconductor memory device may be either volatile or non-volatile, depending on the type of memory element and the memory architecture employed. An example of volatile memory device is dynamic random access memory (DRAM), which loses its stored information when power is interrupted or lost. Non-volatile memory device, such as magnetic random access memory (MRAM) or other types of resistance-based memory devices, can retain stored information when powered off.

A resistance-based memory element can be classified into at least one of several known groups based on its resistance switching mechanism. The memory element of Phase Change Random Access Memory (PCRAM) may comprise a phase change chalcogenide compound, which can switch between a resistive amorphous phase and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of a MRAM device, one of the ferromagnetic layers will switch its magnetization direction with respect to that of the other magnetic layer, thereby changing the electrical resistance of the element.

To be cost competitive, a small memory cell size is desired in order to increase device density on wafers. One way to achieve this is to simply shrink the minimum feature size, F, normally associated with a particular manufacturing process. In memory applications where memory cells are arranged in dense and repetitive patterns, photolithography is more constrained by the pitch of the feature pattern rather than the feature size itself. This is because the feature size can be modulated by photo lithography process conditions, such as exposure and resist development, but shrinkage of the feature pitch would require shorter wavelength light source and/or significant improvement in optics. In reality, the scaling of the device size in a dense array, such as that in memory applications, is limited by the minimum feature pitch of 2F. Moreover, it is normally assumed that the minimum feature size is half of the corresponding minimum pitch. Accordingly, the minimum pitch between two repetitive features on a same mask layer would be 2F, as would be understood by one of ordinary skill in the art.

Figure 1:
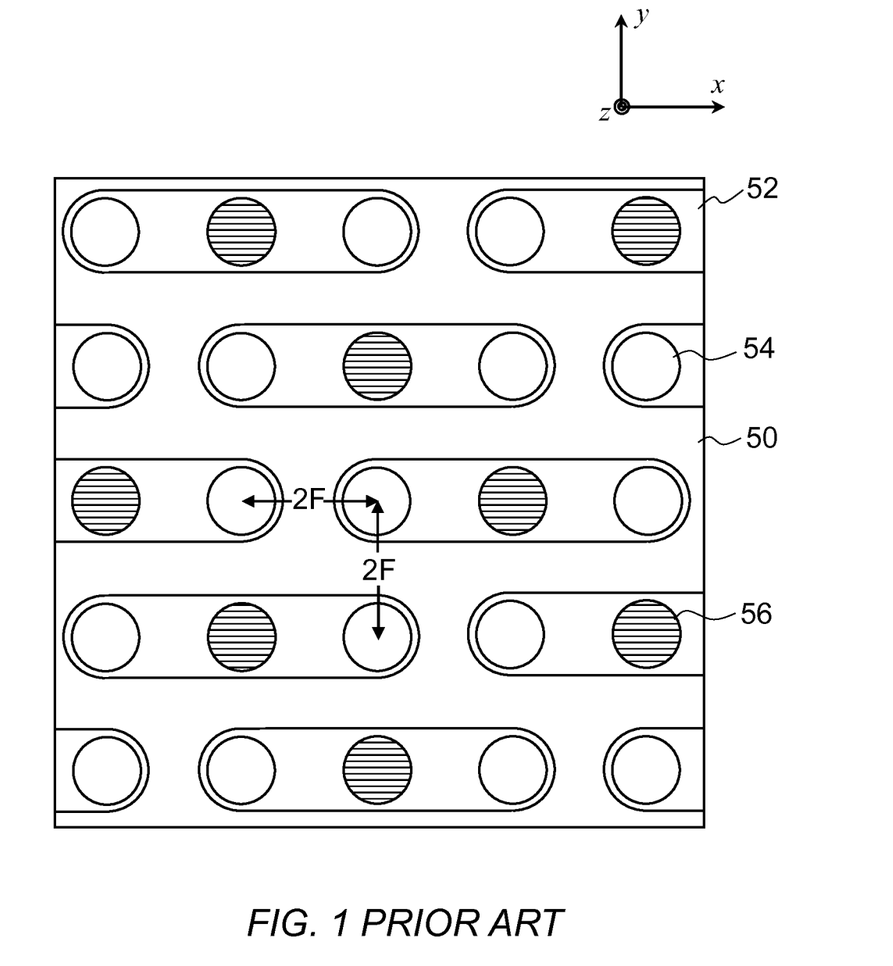
FIG. 1 is a top planar view of a conventional memory device including a plurality of active regions; machine embodying features of the present invention for manufacturing ball bearings.

Another approach to reduce the memory cell size is to use a compact cell structure. Recent advances in semiconductor processing, such as implementation of buried gate and oblique active region, have reduced the memory cell size of DRAM to $6F^2$. For example, FIG. 1 is a top view that illustrates the arrangement of an array of $6F^2$ memory cells for a memory device as disclosed by Baek et al. in U.S. Pat. No. 8,084,801. The memory device includes a semiconductor substrate 50 and a plurality of active regions 52 formed therein. The active regions 52 have an elongated shape extending along the x-direction and are arranged in a staggered pattern along the x-direction. Each active region 52 has two source contacts 54 formed on top of the end portions thereof and a bit contact 56 disposed on the central portion thereof. For reasons of clarity, word lines in the form of buried gate and bit lines are not shown herein. Each source contact 54 has a memory element (not shown) formed thereon. In the cell layout shown in FIG. 1, each memory cell, which includes a transistor and a memory element, has a cell size of $6F^2$ if the center-to-center spacing between two closest neighbors of the source contacts 54 is 2F. Assuming the source contacts 54 have a diameter of about 1F, then the gap between two closest neighbors is about 1F. The memory elements, which are formed on top of the source contacts 54, are subjected to the same geometric constraint with the center-to-center spacing between two closest neighbors being 2F. For $6F^2$ memory cell design, such as the one shown in FIG. 1, it is desirable to increase the minimum spacing between two adjacent memory elements to increase the gap therebetween for easing processing constraints or to increase the memory size for improving memory performance or both.

For the foregoing reasons, there is a need for a $6F^2$ memory device that has a center-to-center spacing between adjacent memory elements greater than 2F and that can be inexpensively manufactured.

SUMMARY

The present invention is directed to a device that satisfies this need. A memory device having features of the present invention comprises a plurality of first level contacts arranged in an array with every third row vacant along a first direction, thereby forming multiple contact regions separated by multiple vacant regions along the first direction with each of the multiple contact regions comprising a first row and a second row of the first level contacts extending along a second direction substantially perpendicular to the first direction; a first and second plurality of second level contacts formed on top of the first level contacts with the second plurality of second level contacts having elongated shape extending into the vacant regions adjacent thereto along the first direction; and a first and second plurality of memory elements formed on top of the first and second plurality of second level contacts, respectively, thereby permitting the memory elements to have greater center-to-center distance between two closest neighbors than the first level contacts.

In an embodiment where the plurality of the first level contacts are arranged in a square array with every third row vacant, the second plurality of memory elements connected to odd columns along the second direction of the first rows of the first level contacts are disposed a first fixed distance along the first direction from the respective first rows of the first level contacts towards the vacant regions adjacent thereto. The second plurality of memory elements connected to even columns along the second direction of the second rows of the first level contacts are disposed a second fixed distance along the first direction from the respective second rows of the first level contacts towards the vacant regions adjacent thereto.

In another embodiment where the plurality of the first level contacts are arranged in a staggered array with every third row vacant, the second plurality of memory elements electrically connected to the first rows of the first level contacts are disposed a fixed distance along the first direction from the first rows of the first level contacts towards the vacant regions adjacent thereto.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of chemical element A and chemical element B, the material AB can be an alloy, a compound, or a combination thereof, except where the context excludes that possibility.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 mm and whose upper limit is 100 nm.

Figure 2:
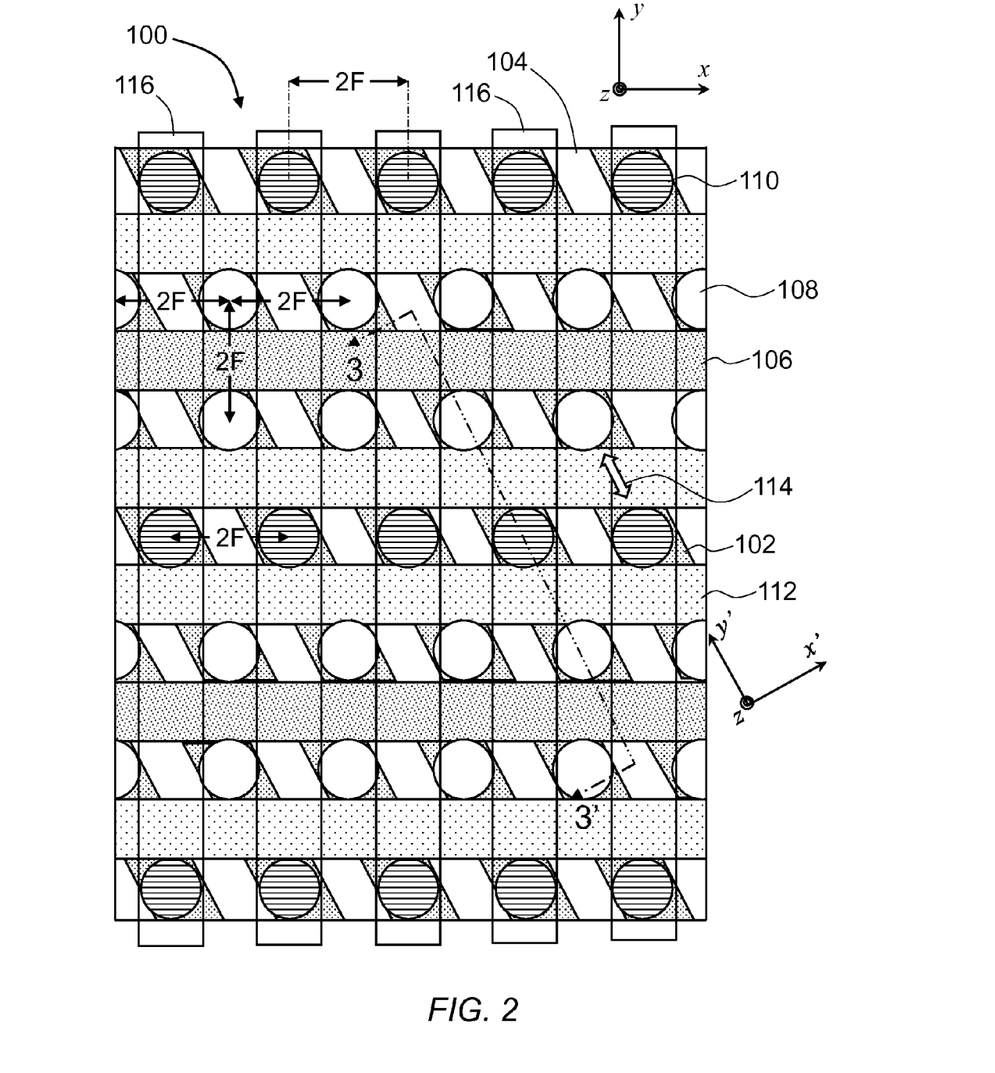
FIG. 2 is a top planar view of a memory device embodying features of the present invention.

An embodiment of the present invention as applied to a $6F^2$ memory device will now be described with reference to FIG. 2. Referring now to FIG. 2, the illustrated device 100 comprises an array of oblique active regions 102 formed in a staggered arrangement in the x-direction of the Figure. The oblique active regions 102 are individually separated by a plurality of device isolation regions 104 in the x'-direction and a plurality of isolation gates 106 in the y-direction of the Figure. Each of the oblique active regions 102 has an elongated shape with two source contacts 108 formed on top of the end portions thereof and a bit contact 110 disposed on the central portion thereof. The source contacts 108 in the memory device 100 are arranged in a square array with every third row missing along the y-direction. The center-to-center spacing between one of the source contacts 108 and the three closest neighbors is 2F. The bit contacts 110 are also arranged in a 2F pitched square array but with every first and second rows missing. Accordingly, the center-to-center spacing between two closest neighbors of the bit contacts 110 is 2F. The arrays of the source contacts 108 and the bit contacts 110 are meshed together by replacing the missing third rows of the source contacts 108 with the array of bit contacts 110 having a 1F offset in the x-direction. As such, the source contact 108 and the bit contacts 110 do not align to each other along the y-direction. For reasons of clarity, insulating material surrounding the source contacts 108 and the bit contacts 110 are not shown in FIG. 2 in order to expose the structure beneath the insulating material.

The $6F^2$ memory device 100 also includes a plurality of gates 112 traversing the oblique active regions 102 in between the source contacts 108 and the bit contacts 110 along the x-direction. The portions of the oblique active regions 102 beneath the source contacts 108 and the bit contacts 110 are source and drain regions, respectively, and have a first type of conductivity, which is opposite to a second type of conductivity in the other portions of the oblique active regions 102 beneath the gates 112. In an embodiment, the first type of conductivity is n type while the second type of conductivity is p type. Accordingly, each of the oblique active regions 102 includes a pair of selection transistors sharing a drain formed beneath a respective one of the bit contacts 110. Upon application of an appropriate voltage to one of the gates 112, conductive channels 114 between source and drain are formed therebeneath in respective active regions 102. The memory device 100 may further include a plurality of bit lines 116 extending along the y-direction and having a pitch of 2F in the x-direction. Each of the bit lines 116 is coupled to a respective row of bit contacts 110 along a direction that is substantially perpendicular to the gates 112 and the isolation gates 106.

Figure 3:
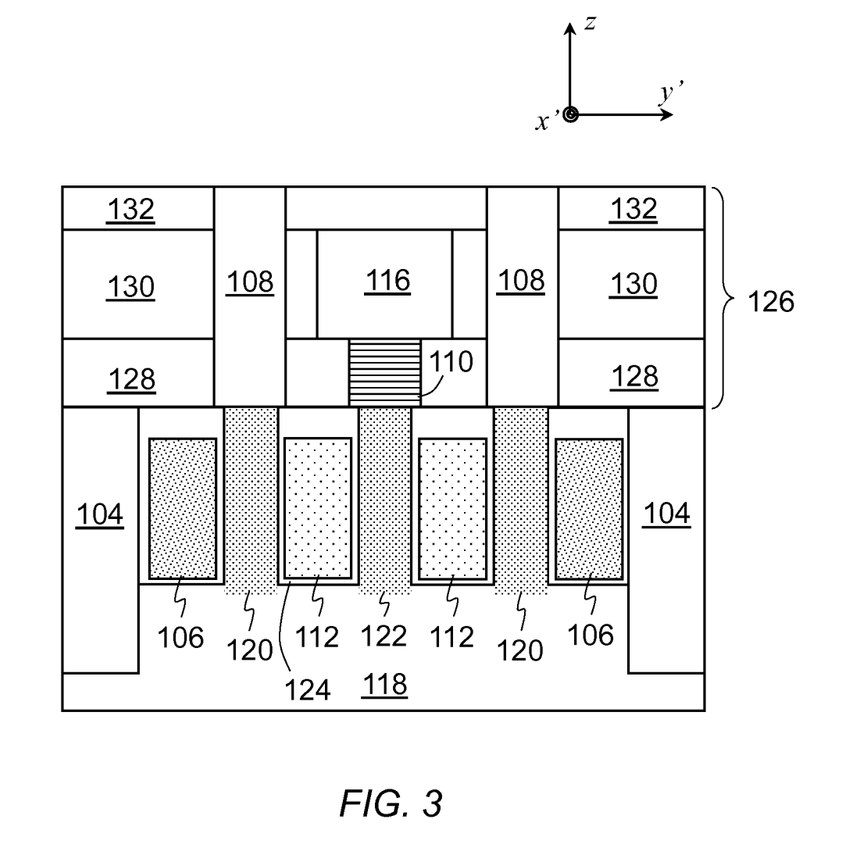
FIG. 3 is a cross sectional view of the memory device of FIG. 2.

FIG. 3 is a cross sectional view of the memory device 100 exposing a pair of selection transistors formed in one of the active regions 102 and respective contacts coupled thereto. In the drawing, numerals 104 to 116 denote the same components or features as those shown in FIG. 2. The active region and the pair of transistors formed therein are formed in a semiconductor substrate 118 having a second type conductivity. Each of the selection transistors includes a respective one of source regions 120, a respective one of common drain regions 122 shared with the other transistor, and a respective one of the gates 112 formed therebetween. The source 120 and drain 122 regions have the first type of conductivity, opposite to the second type of conductivity associated with the substrate 118. The gate 112 is buried in the substrate 118 and is insulated from the source 120 the drain 122 regions and the substrate 118 by a dielectric layer 124. When an appropriate voltage is applied to one of the gates 122, a conductive channel is formed therebeneath in the substrate region adjacent to the dielectric layer 124, thereby allowing a current to flow between the drain region 122 and the source region 120 adjacent thereto. The pair of transistors are segregated from other transistors in the y-direction by a pair of buried isolation gates 106, which are kept at 0 V to prevent formation of conductive channels therebeneath. The transistors and the isolation gates 106 are bounded by the device isolation regions 104 in the y'-direction.

With continuing reference to FIG. 3, each of the source regions 120 has one of the source contacts 108 disposed thereon and each of the drain regions 122 has one of the bit contacts 110 disposed thereon. The source contacts 108 and the bit contacts 110 are surrounded by an insulating interlayer 126, which may comprise a first 128, second 130, and third 132 insulating sublayers. Each of the bit contacts 110 is coupled to a respective one of the bit lines 116 formed thereon. Each of the bit lines 116, which extends along the y-direction, and the underlying bit contacts 110 are buried in the insulating interlayer 126. The top of the source contacts 108 are elevated above the bit lines 116 and are exposed on top of the insulating interlayer 126. Each of the source contacts 108 is electrically connected to a memory element (not shown) formed directly or indirectly thereabove.

Figure 4:
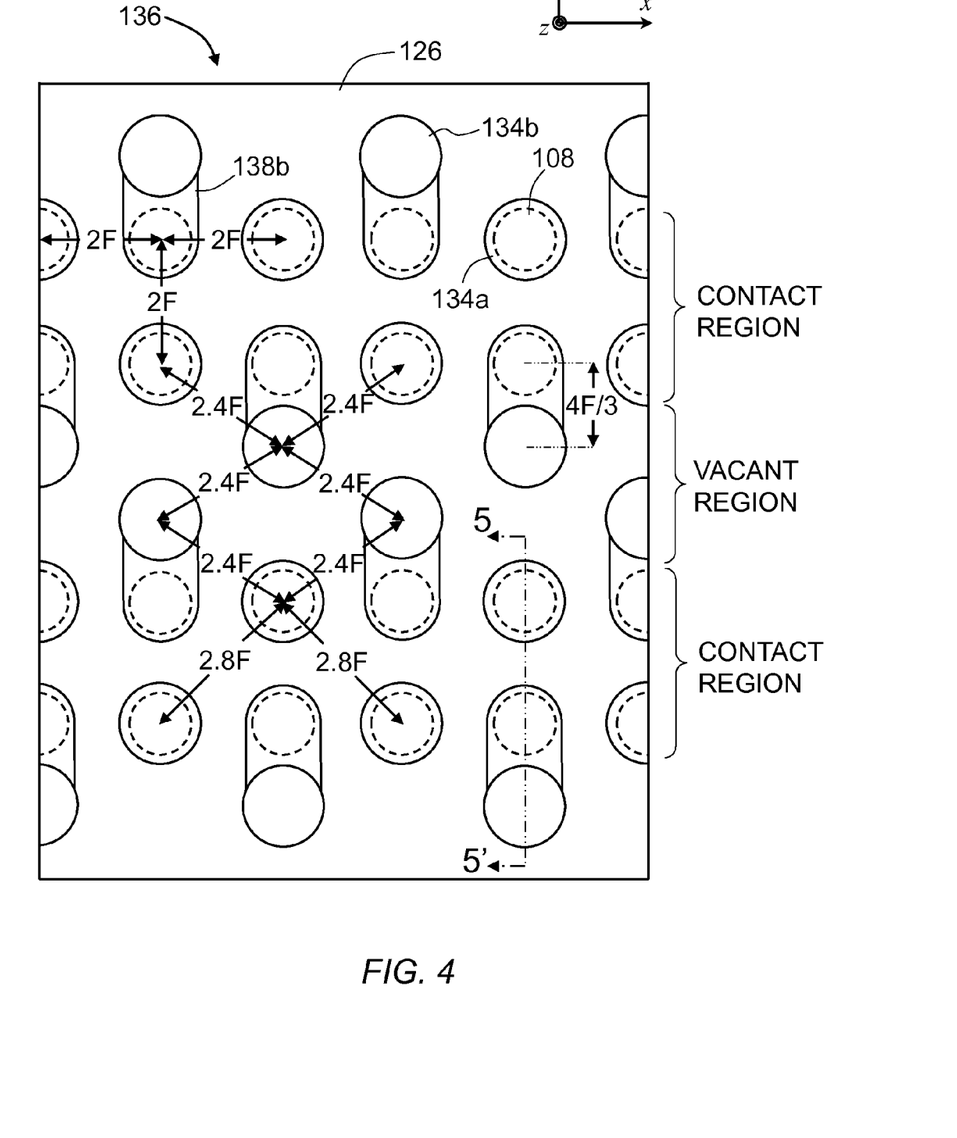
FIG. 4 is a top planar view of a memory device with increased center-to-center spacing between adjacent memory elements according to an embodiment of the present invention.
Figure 5:
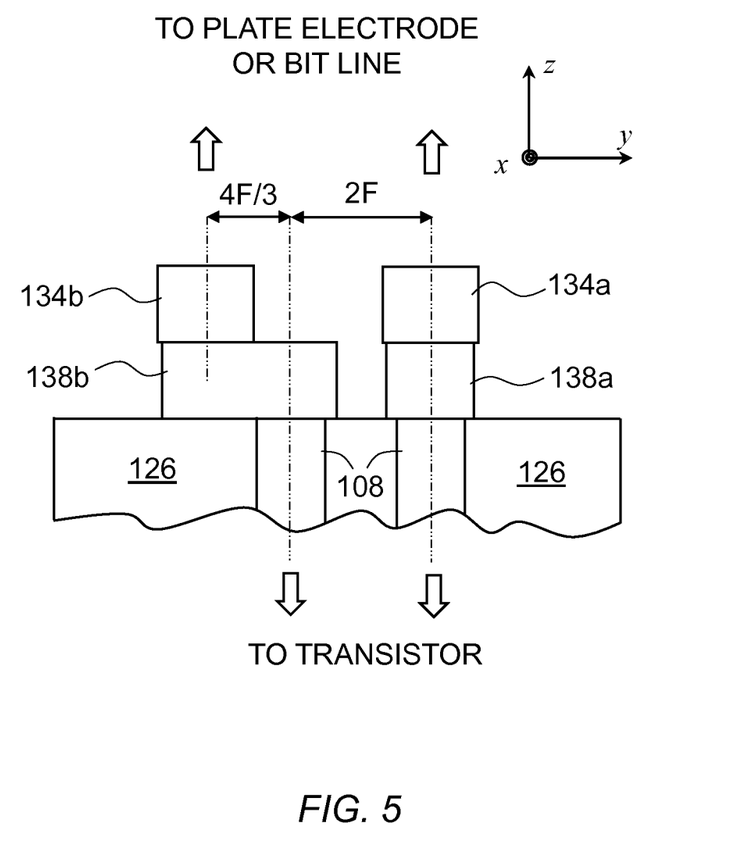
FIG. 5 is a cross sectional view of the memory device of FIG. 4.

FIG. 4 is a top planar view of the memory device illustrated in FIGS. 2 and 3 with an array of memory elements 134a and 134b formed thereon. The memory device 136 of FIG. 4 has the source contacts 108 with the top surface that is substantially coplanar with the top surface of the insulating interlayer 126 surrounding the source contacts 108 as illustrated in the cross sectional view of FIG. 5. With continuing reference to FIG. 5, two types of memory contacts are formed on top of the source contacts 108: standard memory contacts 138a with a substantially circular or equiaxed cross section when viewed from top and extended memory contacts 138b with a substantially elongated cross section extending along the y-direction (in positive and negative y-directions). A first plurality of memory elements 134a and a second plurality of memory elements 134b are formed on top of the standard memory contacts 138a and the extended memory contacts 138b, respectively. The memory elements 134a and 134b are substantially identical except for the underlying memory contacts.

Referring now to FIG. 4, the plurality of source contacts 108 are arranged in a square array with every third row vacant along the y-direction, thereby forming multiple contact regions separated by multiple vacant regions along the y-direction. Each of the multiple contact regions includes a first row and a second row of the source contacts 108 extending along the x-direction, which is substantially orthogonal to the y-direction. In an embodiment, the minimum center-to-center distance between two neighboring source contacts 108 within a contact region is 2F. Accordingly, the minimum center-to-center distance between two source contacts 108 in two neighboring contact regions is 4F. Instead of confining all memory elements 134a and 134b directly above the source contacts 108 in the contact regions, the extended memory contacts 138b with the elongated shape shift the memory elements 134b towards the vacant regions adjacent thereto along the y-direction (in positive and negative y-directions) to increase the minimum center-to-center spacing between two neighbors of the memory elements 134a and 134b. The memory elements 134b may be electrically connected to odd columns of the first rows and even columns of the second rows of the source contacts 108 in the contact regions by the way of the extended memory contacts 138b. Alternatively, the memory elements 134b may be electrically connected to even columns of the first rows and odd columns of the second rows of the source contacts 108 in the contact regions. The memory elements 134b may shift a distance from the source contacts 108 connected thereto towards the adjacent vacant regions. The shifted distance may be up to ⅔ of the center-to-center spacing between two neighboring source contacts 108. In embodiments where the center-to-center spacing between two neighboring source contacts 108 is 2F, the shifted distance may be up to 4F/3. In another embodiment, the shifted distance is ⅔ of the center-to-center spacing between two neighboring source contacts 108 or 4F/3 for the center-to-center spacing of 2F, resulting in a minimum center-to-center spacing of 2.4F between two closest neighbors of the memory elements 134a and 134b.

The present invention may be applied to different types of memory devices. For DRAM application, each of the memory elements 134a and 134b may comprise a capacitor. Moreover, the memory elements 134a and 134b are connected to at least one common plate electrode (not shown) formed thereabove.

For other memory applications in which the memory elements 134a and 134b may switch their resistance state by any suitable switching mechanism, such as but not limited to phase change, precipitate bridging, magnetoresistive switching, or combinations thereof, the bit lines 116, the source regions 120, and common drain regions 122 may be operated as source lines, drain regions, and common source regions, respectively, while the memory elements 134a and 134b are electrically connected to a plurality of bit lines (not shown) formed thereabove. In one embodiment, each of the memory elements 134a and 134b comprises a phase change chalcogenide compound, such as but not limited to $Ge_2Sb_2Te_5$ or AgInSbTe, which can switch between a resistive amorphous phase and a conductive crystalline phase. In another embodiment, each of the memory elements 134a and 134b comprises a nominally insulating metal oxide material, such as but not limited to NiO, $TiO_2$, or $Sr(Zr)TiO_3$, which can switch to a lower electrical resistance state as the metal rich precipitates grow and link to form conductive paths upon application of an appropriate voltage. In still another embodiment, each of the memory elements 134a and 134b comprises two layers of ferromagnetic materials with an insulating electron tunnel junction layer interposed therebetween. When a switching pulse is applied, one of the ferromagnetic layers will switch its magnetization direction, thereby changing the electrical resistance of the element.

For a conventional memory device having a center-to-center spacing of 2F between two neighboring source contacts, two neighboring memory elements would also have a center-to-center spacing of 2F because the memory elements of the conventional memory device are formed directly above the source contacts. The present invention can advantageously increases the minimum center-to-center spacing between memory elements from 2F to 2.4F. The wider spacing would allow larger gap between the memory elements to increase process margin or larger memory element to improve performance or both.

Figure 6:
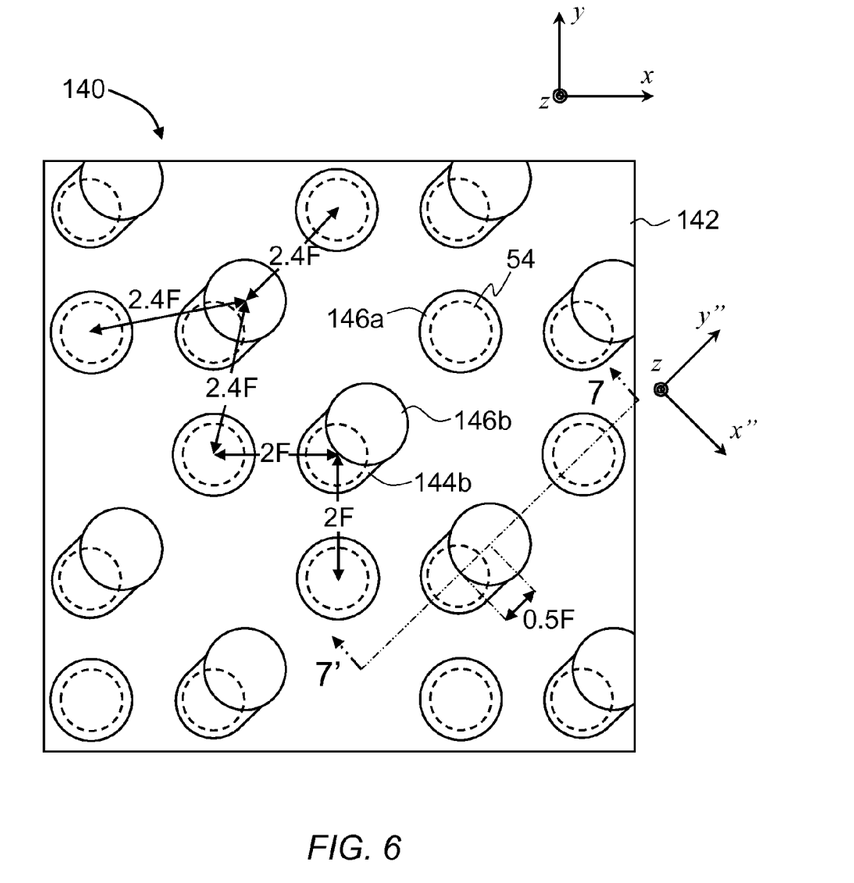
FIG. 6 is a top planar view of another memory device with increased center-to-center spacing between adjacent memory elements according to another embodiment of the present invention.
Figure 7:
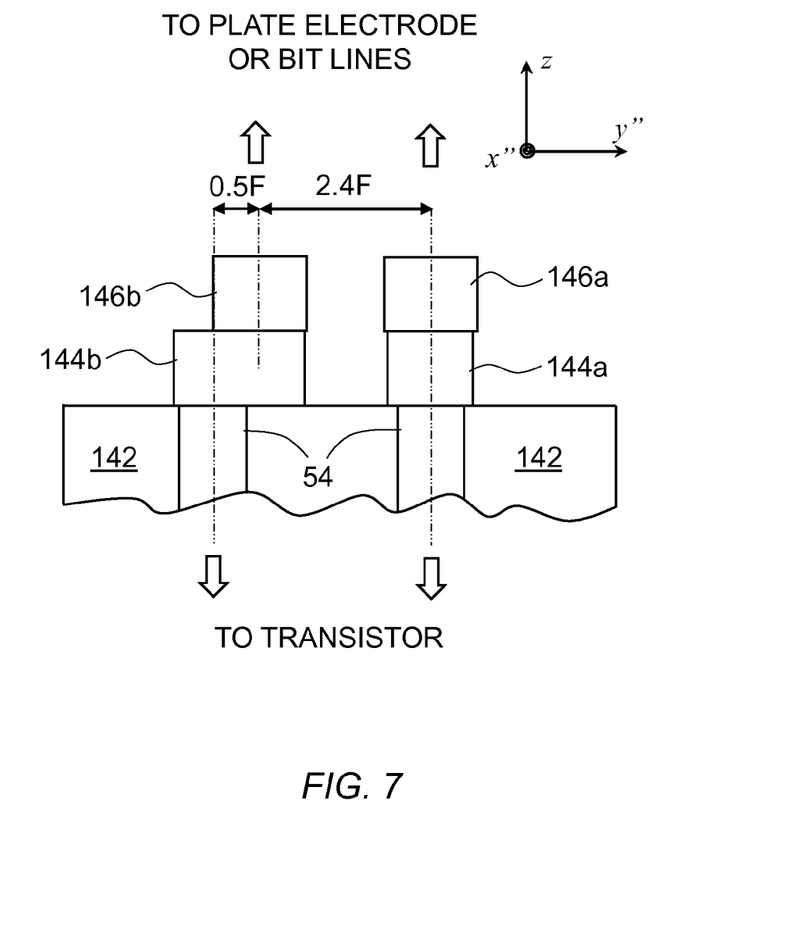
FIG. 7 is a cross sectional view of the memory device of FIG. 6.

The present invention may also be applied to other memory devices with different arrangements of source contacts, such as but not limited to the memory device illustrated in FIG. 1. FIG. 6 is a top planar view of the memory device of FIG. 1 with memory elements formed thereon. The memory device 140 of FIG. 6 has the source contacts 54 arranged in a staggered array with every third row vacant when viewed along the y"-direction, thereby forming multiple contact regions separated by multiple vacant regions along the y"-direction. The top surface of the source contacts 54 is substantially coplanar with the top surface of an insulating interlayer 142 surrounding the source contacts 54 as illustrated in the cross sectional view of FIG. 7. With continuing reference to FIG. 7, two types of memory contacts are formed on top of the source contacts 54: standard memory contacts 144a with a substantially circular or equiaxed cross section when viewed from top and extended memory contacts 144b with a substantially oval or elongated cross section extending along the y"-direction (in positive or negative y"-direction). A first plurality of memory elements 146a and a second plurality of memory elements 146b are formed on top of the standard memory contacts 144a and the extended memory contacts 144b, respectively. The first plurality of memory elements 146a formed on the standard memory contacts 144a are disposed directly above the respective source contacts 54 electrically connected thereto, while the second plurality of memory elements 146b formed on the extended memory contacts 144b are disposed a distance from the respective source contacts 54 electrically connected thereto towards the adjacent vacant regions.

Referring now to FIG. 6, the plurality of source contacts 54 of the memory device 140 are arranged in a staggered array with every third row vacant along the y"-direction to form multiple contact regions separated by multiple vacant regions along the y"-direction. Each of the multiple contact regions includes a first row and a second row of the source contacts 54 extending along the x"-direction, which is substantially orthogonal to the y"-direction. Instead of confining all memory elements 146a and 146b directly above the source contacts 54 in the contact regions, the extended memory contacts 144b formed on top of either the first or second rows of the source contacts 54 in the contact regions shift the position of the memory elements 146b a distance from the respective sources contacts 54 electrically connected thereto towards the adjacent vacant regions. The memory elements 146b may be shifted a distance up to about ¼ of the center-to-center spacing between two neighboring source contacts 54. For embodiments in which the center-to-center spacing between two neighboring source contacts 54 is 2F, the memory elements 146b may be shifted up to 0.5F towards the adjacent vacant regions along the y"-direction (in positive or negative y"-direction). In one embodiment, the memory elements 146b are shifted 0.5F towards the adjacent vacant regions along the y"-direction, thereby increasing the center-to-center spacing between two neighbors of the memory elements 146a and 146b from 2F to 2.4F.

While the present invention has been shown and described with reference to certain preferred embodiments, it is to be understood that those skilled in the art will no doubt devise certain alterations and modifications thereto which nevertheless include the true spirit and scope of the present invention. For example, the present invention of using extended memory contacts to increase the center-to-center spacing between adjacent memory elements by moving some memory elements from the contact regions to the vacant regions can be applied to other array arrangements for the source contacts. Thus the scope of the invention should be determined by the appended claims and their legal equivalents, rather than by examples given.

What is claimed is:

1. A semiconductor memory device comprising:
a plurality of first level contacts arranged in an array with every third row vacant along a first direction, thereby forming multiple contact regions separated by multiple vacant regions along said first direction with each of said multiple contact regions comprising a first row and a second row of said first level contacts extending along a second direction substantially perpendicular to said first direction;
a first and second plurality of second level contacts formed on top of said first level contacts and coupled thereto, said second plurality of second level contacts having elongated shape extending into said vacant regions adjacent thereto along said first direction; and
a first and second plurality of memory elements formed on top of said first and second plurality of second level contacts, respectively,
wherein said first and second plurality of memory elements are arranged to have greater center-to-center spacing between two closest neighbors than said first level contacts.

2. The semiconductor memory device of claim 1, wherein said second plurality of memory elements are shifted a fixed distance from said first level contacts electrically connected thereto towards said vacant regions adjacent thereto along said first direction.

3. The semiconductor memory device of claim 1, further comprising a plurality of transistors with each transistor coupled to one of said first level contacts formed thereon.

4. The semiconductor memory device of claim 1, wherein said first plurality of second level contacts have a substantially circular or equiaxed cross sectional shape.

5. The semiconductor memory device of claim 1, wherein said first and second plurality of memory elements are substantially the same.

6. The semiconductor memory device of claim 1, wherein each of said first and second plurality of memory elements comprises a capacitor.

7. The semiconductor memory device of claim 1, wherein each of said first and second plurality of memory elements has at least two resistance states.

8. The semiconductor memory device of claim 1, wherein each of said first and second plurality of memory elements comprises a phase change chalcogenide compound.

9. The semiconductor memory device of claim 1, wherein each of said first and second plurality of memory elements comprises a precipitate bridging metal oxide.

10. The semiconductor memory device of claim 1, wherein each of said first and second plurality of memory elements comprises two ferromagnetic magnetic layers with an insulating tunnel junction layer interposed therebetween.

11. The semiconductor memory device of claim 1, wherein said plurality of first level contacts are arranged in a square array with every third row vacant along said first direction.

12. The semiconductor memory device of claim 11, wherein said second plurality of memory elements connected to odd columns along said second direction of said first rows of said first level contacts are disposed a first fixed distance along said first direction from said respective first rows of said first level contacts towards said vacant regions adjacent thereto, said second plurality of memory elements connected to even columns along said second direction of said second rows of said first level contacts are disposed a second fixed distance along said first direction from said respective second rows of said first level contacts towards said vacant regions adjacent thereto.

13. The semiconductor memory device of claim 12, wherein said first fixed distance and said second fixed distance are about ⅔ of center-to-center spacing between two closest neighbors of said first level contacts.

14. The semiconductor memory device of claim 1, wherein said plurality of first level contacts are arranged in a staggered array with every third row vacant along said first direction.

15. The semiconductor memory device of claim 14, wherein said second plurality of memory elements electrically connected to said first rows of said first level contacts are disposed a fixed distance along said first direction from said first rows of said first level contacts towards said vacant regions adjacent thereto.

16. The semiconductor memory device of claim 15, wherein said fixed distance is about ¼ of center-to-center spacing between two closest neighbors of said first level contacts.

\* \* \* \* \*